United States Patent
Maussang et al.

(10) Patent No.: US 11,808,627 B2
(45) Date of Patent: Nov. 7, 2023

(54) GENERATION AND DETECTION OF TERAHERTZ RADIATION WITH AN ARBITRARY POLARIZATION DIRECTION

(71) Applicants: CENTRE NATIONAL DE LA RECHERCHE SCIENTIFIQUE, Paris (FR); Sorbonne Universite, Paris (FR); ECOLE NORMALE SUPERIEURE DE PARIS, Paris (FR); UNIVERSITÉ PARIS CITÉ, Paris (FR)

(72) Inventors: Kenneth Maussang, Montpellier (FR); Sukhdeep Dhillon, Bourg la Reine (FR); Jerome Tignon, Paris (FR)

(73) Assignees: CENTRE NATIONAL DE LA RECHERCHE SCIENTIFIQUE, Paris (FR); SORBONNE UNIVERSITE, Paris (FR); ECOLE NORMALE SUPERIEURE DE PARIS, Paris (FR); UNIVERSITÉ PARIS CITÉ, Paris (FR)

( * ) Notice: Subject to any disclaimer, the term of this patent is extended or adjusted under 35 U.S.C. 154(b) by 386 days.

(21) Appl. No.: 17/043,774

(22) PCT Filed: Mar. 28, 2019

(86) PCT No.: PCT/EP2019/057912
§ 371 (c)(1),
(2) Date: Sep. 30, 2020

(87) PCT Pub. No.: WO2019/185827
PCT Pub. Date: Oct. 3, 2019

(65) Prior Publication Data
US 2021/0018364 A1   Jan. 21, 2021

(30) Foreign Application Priority Data

Mar. 30, 2018 (EP) .................................. 18305368

(51) Int. Cl.
*G01J 1/44* (2006.01)
*G01J 4/04* (2006.01)
(Continued)

(52) U.S. Cl.
CPC . *G01J 1/44* (2013.01); *G01J 1/42* (2013.01); *G01J 3/10* (2013.01); *G01J 3/42* (2013.01);
(Continued)

(58) Field of Classification Search
CPC .......... G01J 1/44; G01J 4/04; G01J 2001/446; G01J 3/42; G01J 1/42; G01J 3/10;
(Continued)

(56) References Cited

U.S. PATENT DOCUMENTS

| 4,859,851 A * | 8/1989 | Wotherspoon .... H01L 27/14669 348/E3.01 |
| 9,224,899 B2 * | 12/2015 | Peytavit .................. H01L 31/09 |

(Continued)

FOREIGN PATENT DOCUMENTS

| CN | 105870582 A | 8/2016 | |
| DE | 102008023991 A1 * | 12/2009 | ............. H01Q 9/005 |

(Continued)

OTHER PUBLICATIONS

Maussang, et al., "Echo Less Photoconductive Antenna Sources for High Resolution Terahertz Time Domain Spectroscopy", IEEE Transactions on Terahertz Science and Technology, vol. 6, Issue: 1, Jan. 2016.
(Continued)

*Primary Examiner* — Jennifer D Bennett
*Assistant Examiner* — Erin R Garber
(74) *Attorney, Agent, or Firm* — BakerHostetler

(57) ABSTRACT

A photoconductive switch for generating or detecting terahertz radiation (TR) is provided. The photoconductive switch may comprise at least a first and a second pair of
(Continued)

Figure 1:
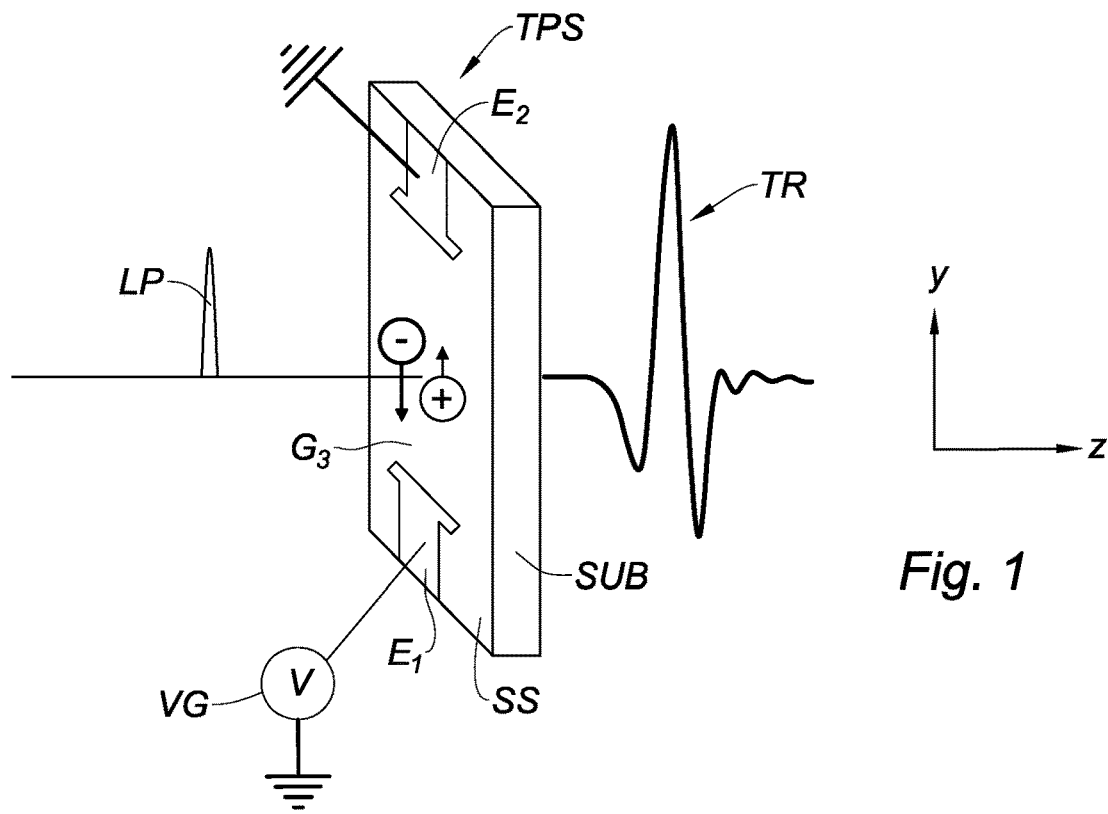

electrodes ($E_V$, $E_H$, $E_{GR}$) on a surface (SS) of a photoconductive substrate, wherein the electrodes of the first pair are separated by a first gap comprising at least a plurality of first rectilinear sections ($G_V$) extending along a first direction (x) and the electrodes of the second pairs are separated by a second gap comprising at least a plurality of second sections ($G_H$) extending along a second direction (y), different from the first direction. The photoconductive switch may further comprise a patterned opaque layer (PML) selectively masking portions of the gaps between the electrodes. Methods and devices for generating and detecting terahertz radiation comprising such photoconductive switches are also provided.

14 Claims, 8 Drawing Sheets

(51) Int. Cl.
| | | |
|---|---|---|
| *H01L 31/0216* | (2014.01) | |
| *H01L 31/0224* | (2006.01) | |
| *H01L 31/09* | (2006.01) | |
| *H01L 31/0304* | (2006.01) | |
| *G01J 4/00* | (2006.01) | |
| *G01J 3/42* | (2006.01) | |
| *G01J 1/42* | (2006.01) | |
| *G01J 3/10* | (2006.01) | |
| *G02F 2/02* | (2006.01) | |

(52) U.S. Cl.
CPC . *G01J 4/00* (2013.01); *G01J 4/04* (2013.01); *H01L 31/0216* (2013.01); *H01L 31/0224* (2013.01); *H01L 31/0304* (2013.01); *H01L 31/09* (2013.01); *G01J 2001/446* (2013.01); *G02F 2/02* (2013.01); *G02F 2203/13* (2013.01)

(58) Field of Classification Search
CPC ........... G01J 4/00; G01J 5/20; H01L 31/0216; H01L 31/0224; H01L 31/0304; H01L 31/09; H01L 31/101; G02F 2203/13; G02F 2/02
See application file for complete search history.

(56) References Cited

U.S. PATENT DOCUMENTS

| | | | | |
|---|---|---|---|---|
| 2008/0023633 | A1* | 1/2008 | Mittleman | G01J 3/42 250/341.1 |
| 2017/0256665 | A1* | 9/2017 | Moon | H01L 31/08 |

FOREIGN PATENT DOCUMENTS

| | | |
|---|---|---|
| DE | 102008023991 A1 | 12/2009 |
| EP | 2 120 291 A | 11/2009 |
| EP | 2410568 A2 * | 1/2012 ..... H01L 31/022433 |
| JP | 2006-317407 A | 11/2006 |
| JP | 2011-511498 A | 4/2011 |
| JP | 2018-507534 A | 3/2018 |
| WO | 2006/047975 A1 | 5/2006 |

OTHER PUBLICATIONS

Notice of Rejection issued in Japanese Patent Application No. 2021-501091 dated Oct. 25, 2022, with English translation.
Bulgarevich, D. S., et al., "Polarization-variable emitter for terahertz time-domain spectroscopy", Optics Express, Nov. 28, 2016, pp. 27160-27165, vol. 24 No. 24.
Castro-Camusa, E. J., et al., "Polarization-sensitive terahertz detection by multicontact photoconductive receivers", Applied Physics Letters, Jun. 16, 2005, pp. 254102-1 to 254102-3, vol. 86.
European Patent Office, Extended European Search Report received for Application No. 18305368.5, dated Sep. 21, 2018, 7 pages, Germany.
Hirota, Yuichi, et al., "Polarization modulation of terahertz electromagnetic radiation by four-contact photoconductive antenna", Optics Express, May 16, 2006, pp. 4486-4493, vol. 14, No. 10.
International Searching Authority, International Search Report and Written Opinion received for International Application No. PCT/EP2019/057912, dated May 6, 2019, 14 pages, European Patent Office, Netherlands.

* cited by examiner

GENERATION AND DETECTION OF TERAHERTZ RADIATION WITH AN ARBITRARY POLARIZATION DIRECTION

CROSS-REFERENCE TO RELATED APPLICATIONS

The present application is a national phase entry of PCT/EP2019/057912, filed on Mar. 28, 2019, which claims the benefit of priority of European Patent Application No. 18305368.5, filed on Mar. 30, 2018, the entire contents of which are hereby incorporated by reference in their entirety for all purposes.

FIELD

The invention relates to a photoconductive switch for generating linearly-polarized terahertz radiation with an arbitrary and electrically-controlled polarization direction and/or for detecting terahertz radiation with an arbitrary polarization direction. It also relates to terahertz radiation generating and detecting apparatuses and methods using such photoconductive switches. The invention lends itself to several applications such as medical and security imaging, submillimeter-astronomy, the detection of gases and—more particularly—non-destructive material analysis.

BACKGROUND

The expression "terahertz radiation" (THz) designates electromagnetic waves having frequencies in an intermediate range between infrared and microwave. More precisely, in the following, "terahertz radiation" will designate radiation having a (central) frequency comprised between 0.1 and 30 THz (1 THz=$10^{12}$ Hz), corresponding to wavelengths approximately comprised between 3 mm and 10 µm.

Over the last decade, technological solutions have emerged that are extremely promising to take advantage of this part of the electromagnetic spectrum. However, polarimetric measurements in THz range, where the polarization of the THz light is controlled, need to be developed further to provide interesting information in the context of material science. For instance, photoelastometry may provide information on mechanical constraints in opaque materials. In the case of one of the most widespread THz techniques, THz time domain spectroscopy (TDS), used for probing transitory or non-equilibrium regimes with nanosecond or picoseconds temporal resolution, the generation of THz pulses is typically performed through ultrafast optical excitation of photoconductive generators (or "switches") comprising at least two non-contacting electrodes on a photoconductive surface.

Here, the emission consists of one given polarization, fixed by the direction of the electrode's geometry itself. Therefore, most polarization measurements are performed through the use of mechanically controlled elements, such as rotational mounts for the switches or wired grid polarizers.

This inherently limits the rapidity and the precision of the measurement.

The paper by D. S. Bulgarevich et al. "Polarization-variable emitter for terahertz time-domain spectroscopy", Optics Express, Vol. 24 No. 24, 28 Nov. 2016, pp. 27160-27165 describes a photoconductive terahertz generator comprising 8 triangular electrodes on a surface of a photoconductive LT-GaAs substrate. This generator allows rotating the polarization direction of the emitted THz radiation, but only in a stepwise manner, with 45° steps. Such a rough polarization control is insufficient for many applications. Photoconductive switches may also be used for detecting terahertz radiation. In this case they typically show a similar limitation, namely they are only sensitive to a single polarization component. Therefore at least two separate measurements using a rotatable switch are required to characterize an arbitrary polarization direction.

The paper by E. Castro-Camusa, J. Lloyd-Hughes, and M. B. Johnston "Polarization-sensitive terahertz detection by multicontact photoconductive receivers", Appl. Phys. Lett. 86, 254102 (2005) describes a three-electrode photoconductive switch allowing performing polarization-sensitive detection of terahertz radiation. This switch has a small sensitive area and is not scalable.

DE 10 2008 023991 discloses a photoconductive switch comprising interdigitated electrodes extending along two perpendicular directions, suitable to generate terahertz radiation with radial, azimuthal or quadripolar polarization. This device, however, is not suitable for generating or detecting linearly-polarized terahertz radiation with an arbitrary and electrically-controlled polarization direction.

The invention aims at overcoming the drawbacks of the prior art. More precisely it aims at providing full and continuous (or, at least, fine-grained) control of the polarization direction of the emitted THz radiation by purely electrical means, and/or at allowing the determination of the polarization direction of a received THz radiation in a single measurement.

BRIEF SUMMARY

The invention achieves these aims by the use of two intermixed orthogonal—or, more generally, nonparallel—photoconductive switches on a same substrate, with independent bias control (for generation) or current measurement (for detection). In emission mode, by adjusting relative field amplitude between the two intermixed switches the direction of the polarization can be adjusted with a high degree of precision. In detection mode, the ratio of the current signals issued from the two intermixed switches is indicative of the polarization direction of the impinging THz radiation.

An object of the present invention is then a photoconductive switch for generating or detecting terahertz radiation comprising: a photoconductive substrate; and a plurality of electrodes on a surface of the photoconductive substrate; characterized in that said plurality of electrodes comprises: a first pair of structured electrodes separated by a first gap comprising at least a plurality of first rectilinear sections extending along a first direction and a second pair of structured electrodes separated by a second gap comprising at least a plurality of second rectilinear sections extending along a second direction, different from the first direction; and in that it further comprises a patterned opaque layer, opaque to at least one of terahertz radiation and visible or infrared radiation suitable to induce an increase of the substrate conductivity, selectively masking portions of the gaps between the electrodes, in such a way that only remain unmasked: first rectilinear sections of the first gap such that, upon application of a first voltage between the electrodes of the first pair and illumination by said visible or infrared radiation, a first electric current flows with a same direction and orientation across all said first rectilinear sections; and second rectilinear sections of the second gap such that, upon application of a second voltage between the electrodes of the second pair and illumination by said visible or infrared radiation, a second electric current flows with a same direction and orientation across all said second rectilinear sections (two opposite orientations being associated to a direction).

Another object of the invention is a device for generating terahertz radiation with a controlled polarization direction comprising such a photoconductive switch; a first controllable voltage generator connected to the electrodes of the first pair, for imposing a first voltage across the first gap; and a second, independently controllable, voltage generator connected to the electrodes of the second pair, for imposing a second voltage across the second gap.

Another object of the invention is a method for generating terahertz radiation with a controlled polarization direction using such a device, comprising the step of: using the first controllable voltage generator for imposing the first voltage across the first gap, and the second controllable voltage generator for imposing the second voltage across the second gap, a ratio of the first and the second voltage being determined as a function of a target polarization direction of the terahertz radiation to be generated; and directing pulsed light towards said region of the surface of the photoconductive substrate.

Another object of the invention is a device for detecting terahertz radiation comprising: a photoconductive switch as above; a first readout circuit connected to the electrodes of the first pair, for detecting a first current flowing through said electrodes; and a second readout circuit connected to the electrodes of the second pair, for detecting a second current flowing through said electrodes.

A further object of the invention is a method for detecting terahertz radiation using such a device, comprising the step of: directing pulsed light towards said region of the surface of the photoconductive substrate; using the first readout circuit for detecting the first current, and the second readout circuit for detecting the second current; and determining a polarization direction of an impinging terahertz radiation from a ratio of the first and the second current.

BRIEF DESCRIPTION OF THE SEVERAL VIEW OF THE DRAWING(S)

Figure 2A:
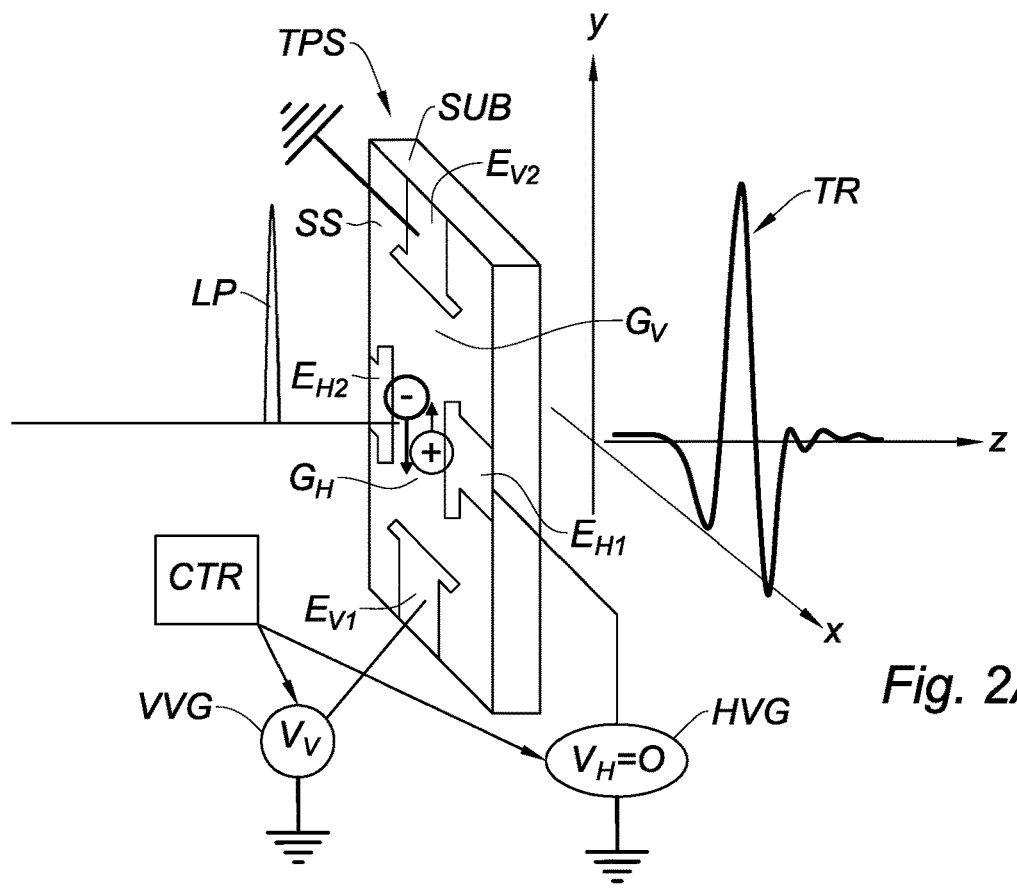
Figure 2B:
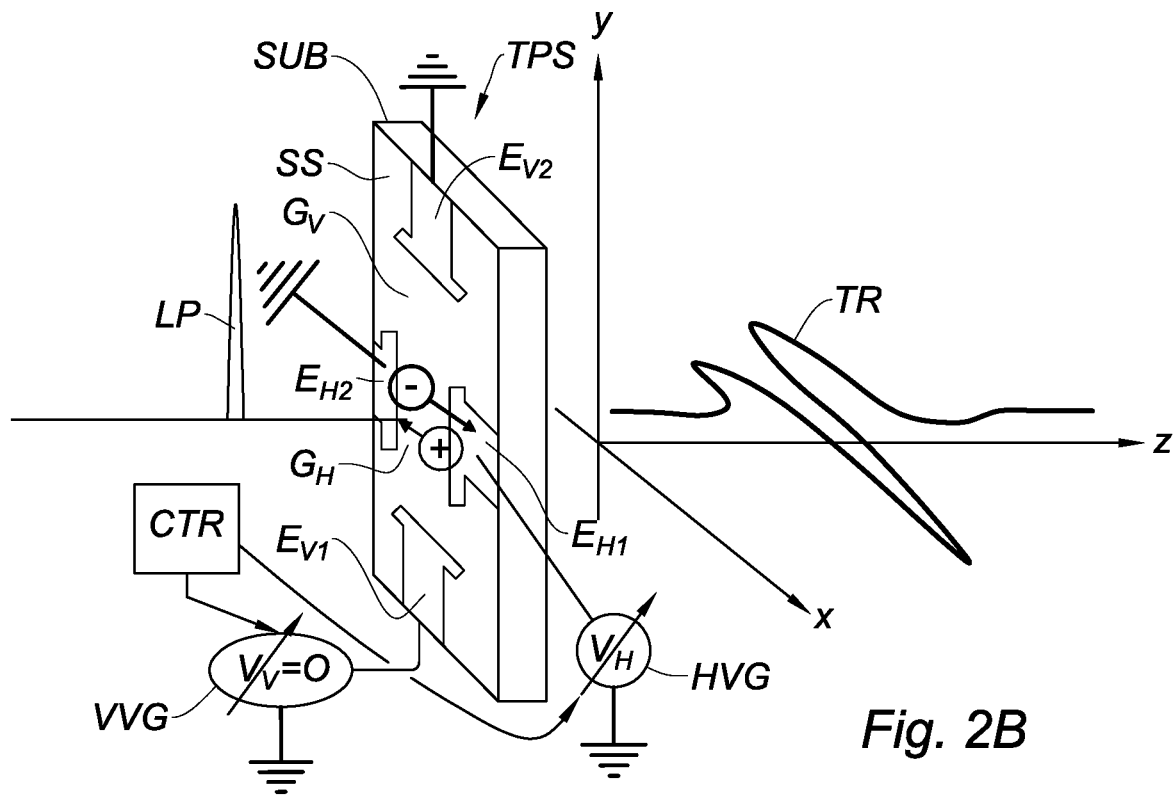
Figure 2C:
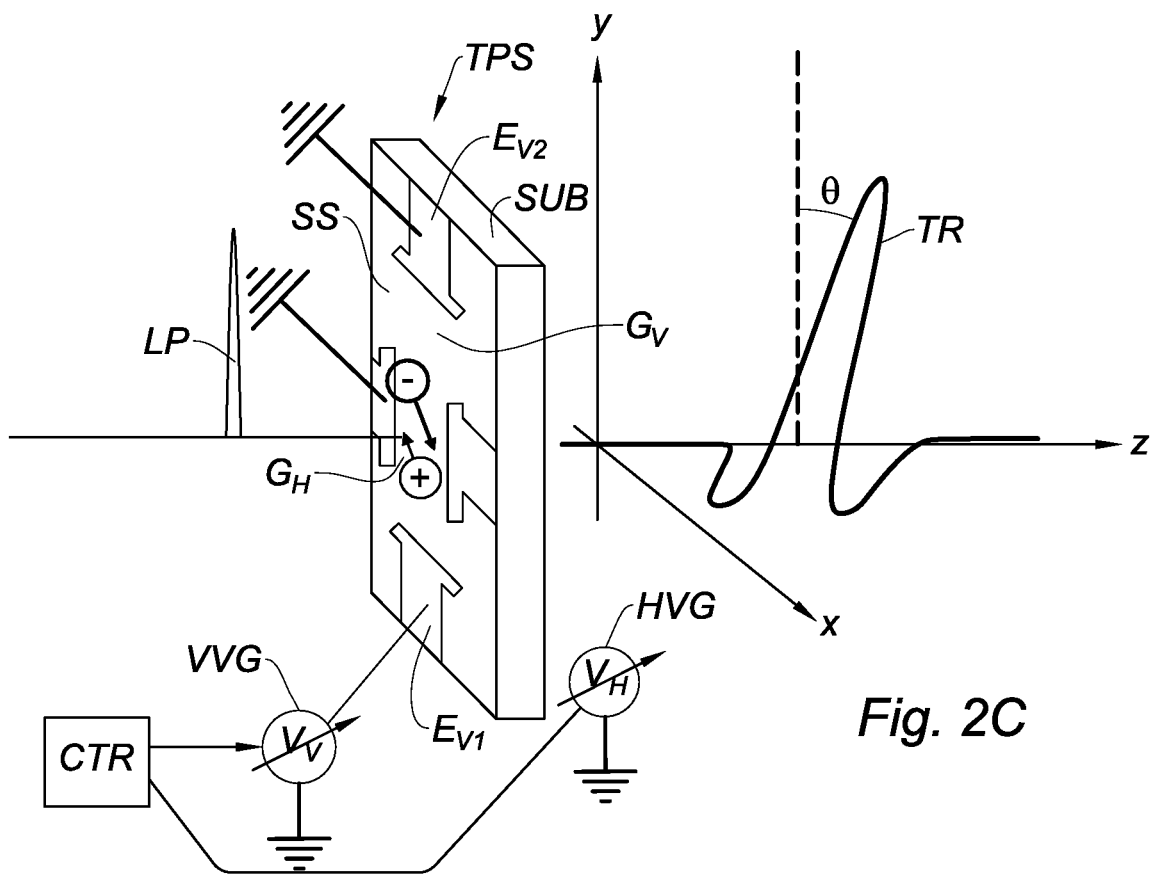
Figure 3:
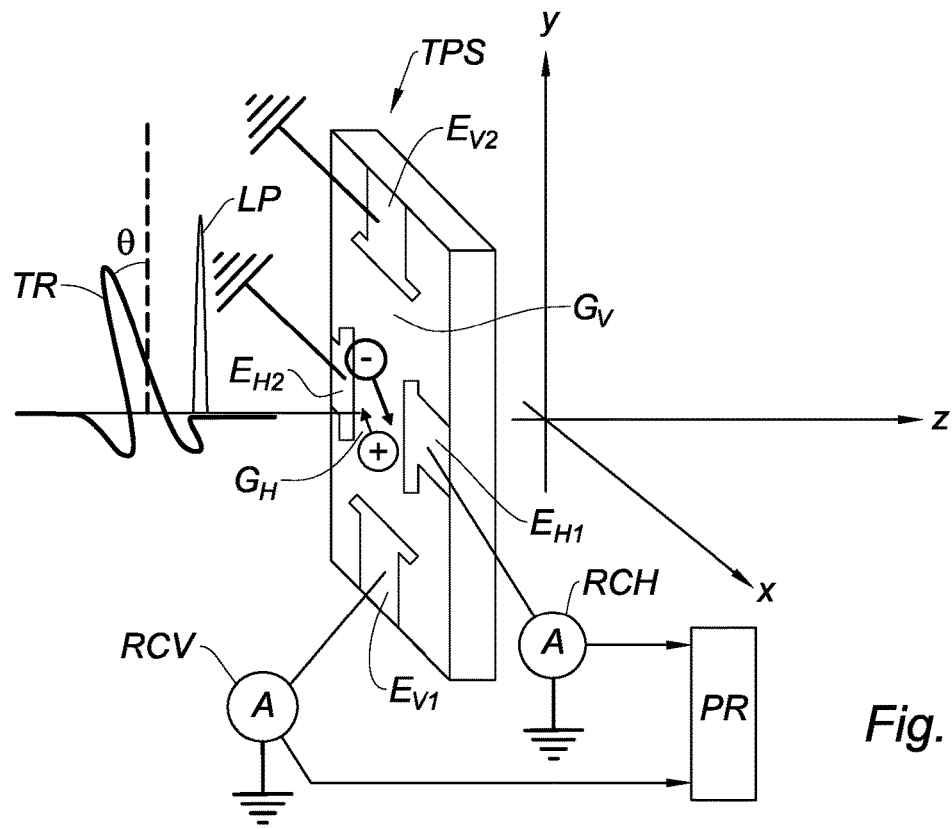
Figure 4A:
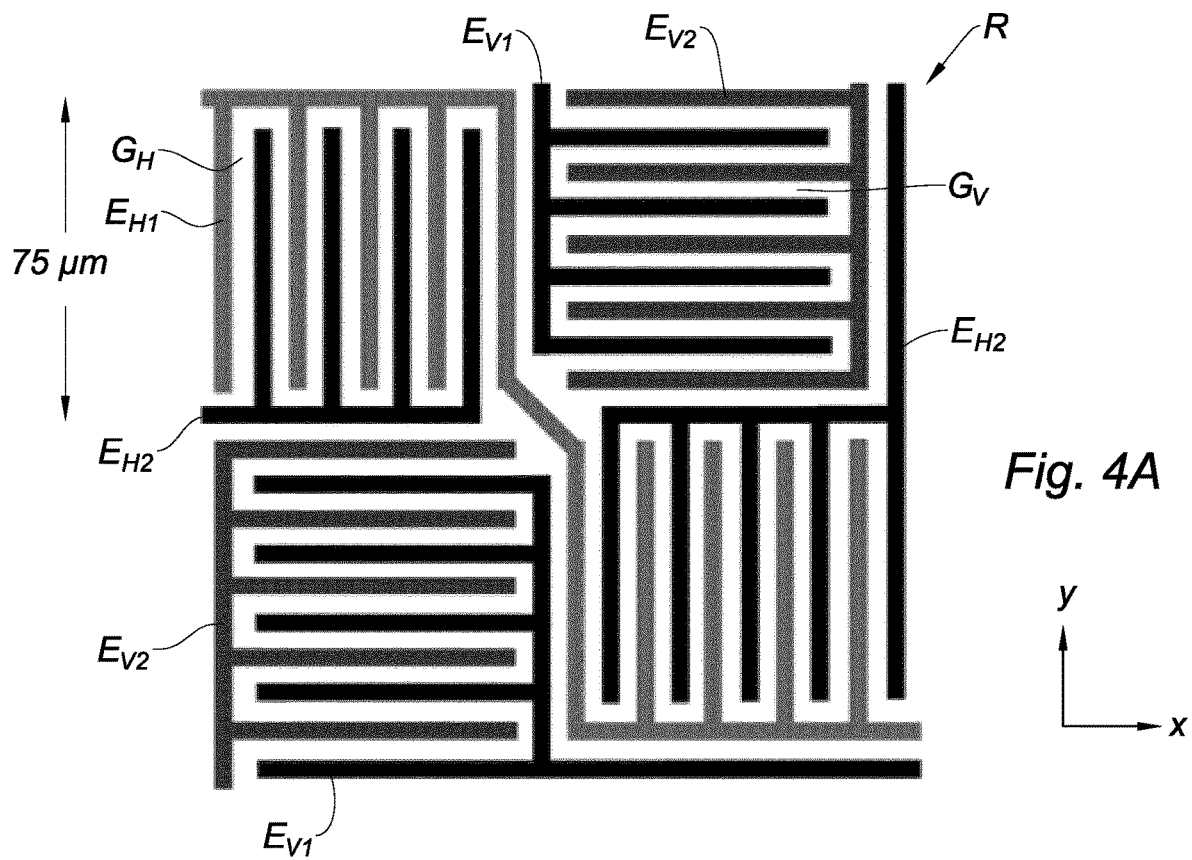
Figure 4B:
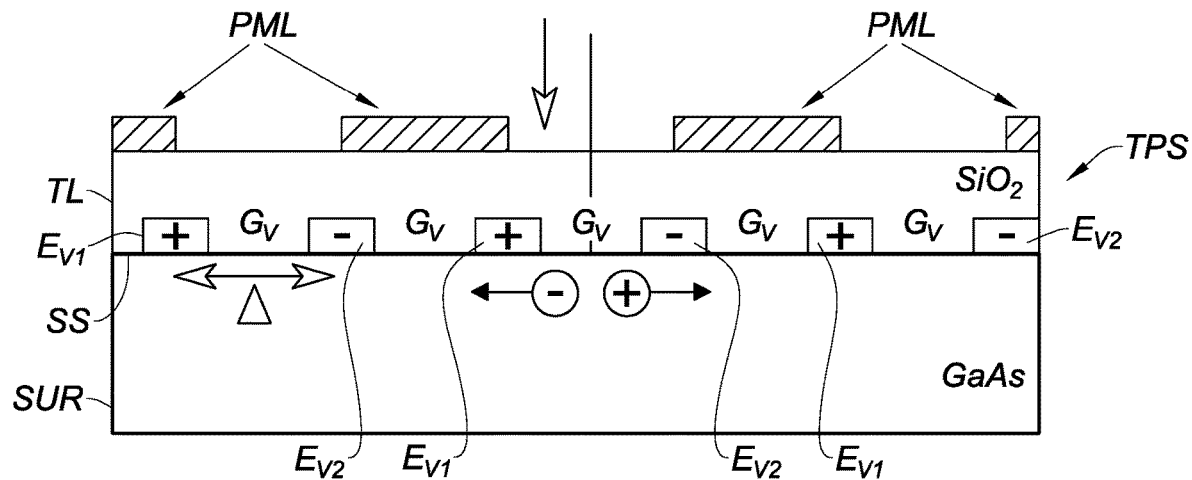
Figure 5:
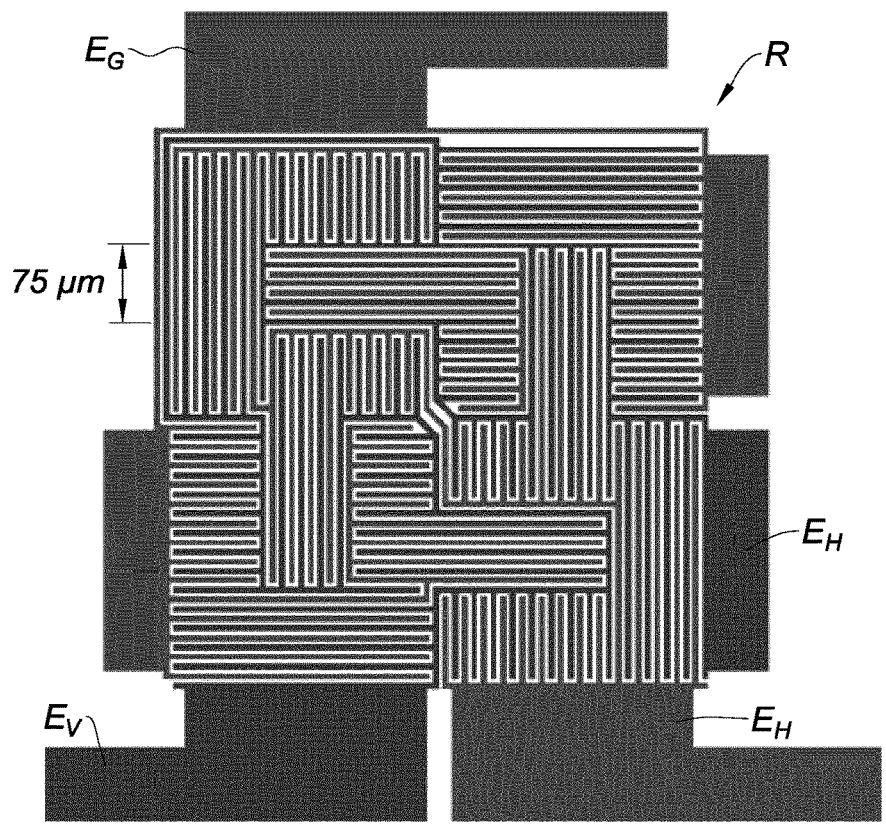
Figure 6A:
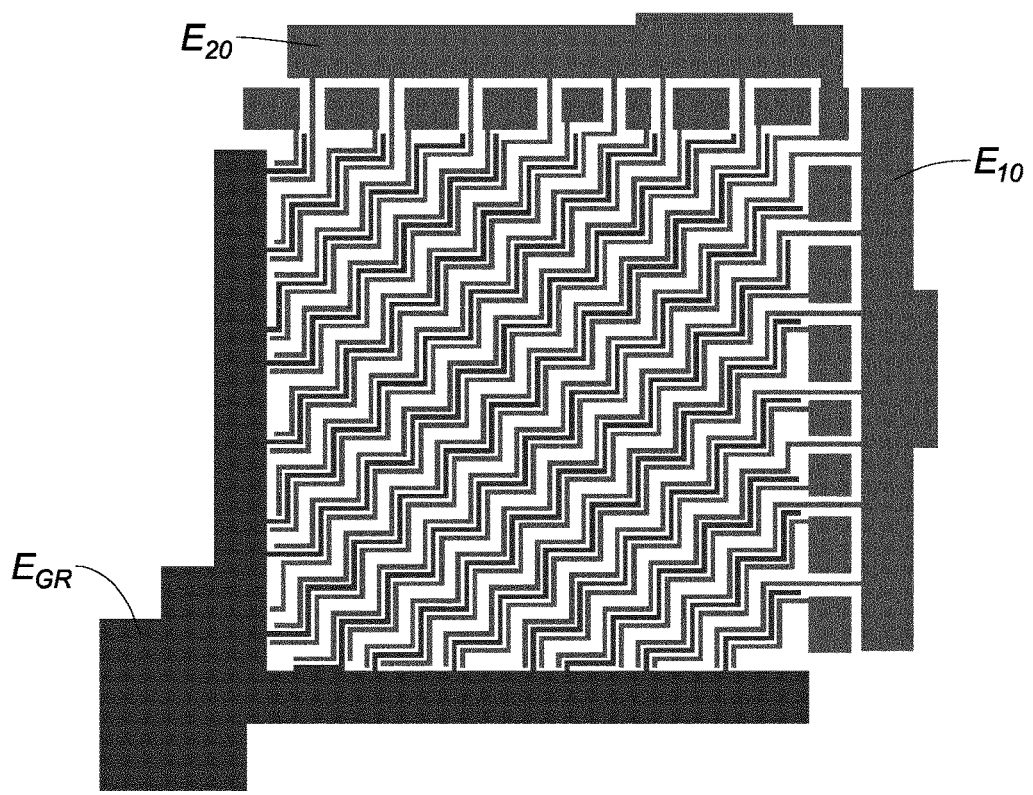
Figure 6B:
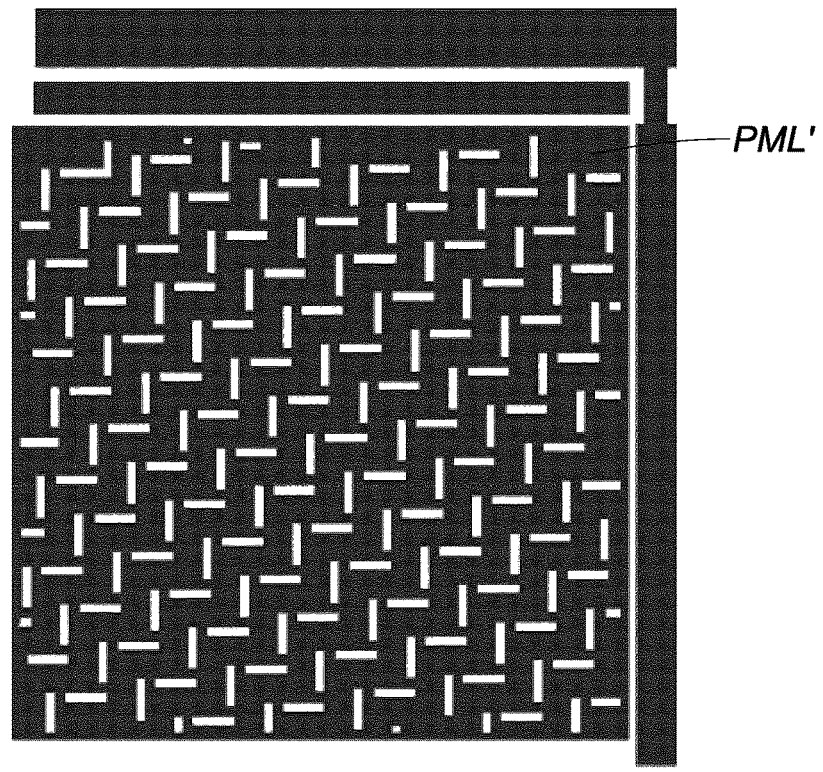
Figure 7:
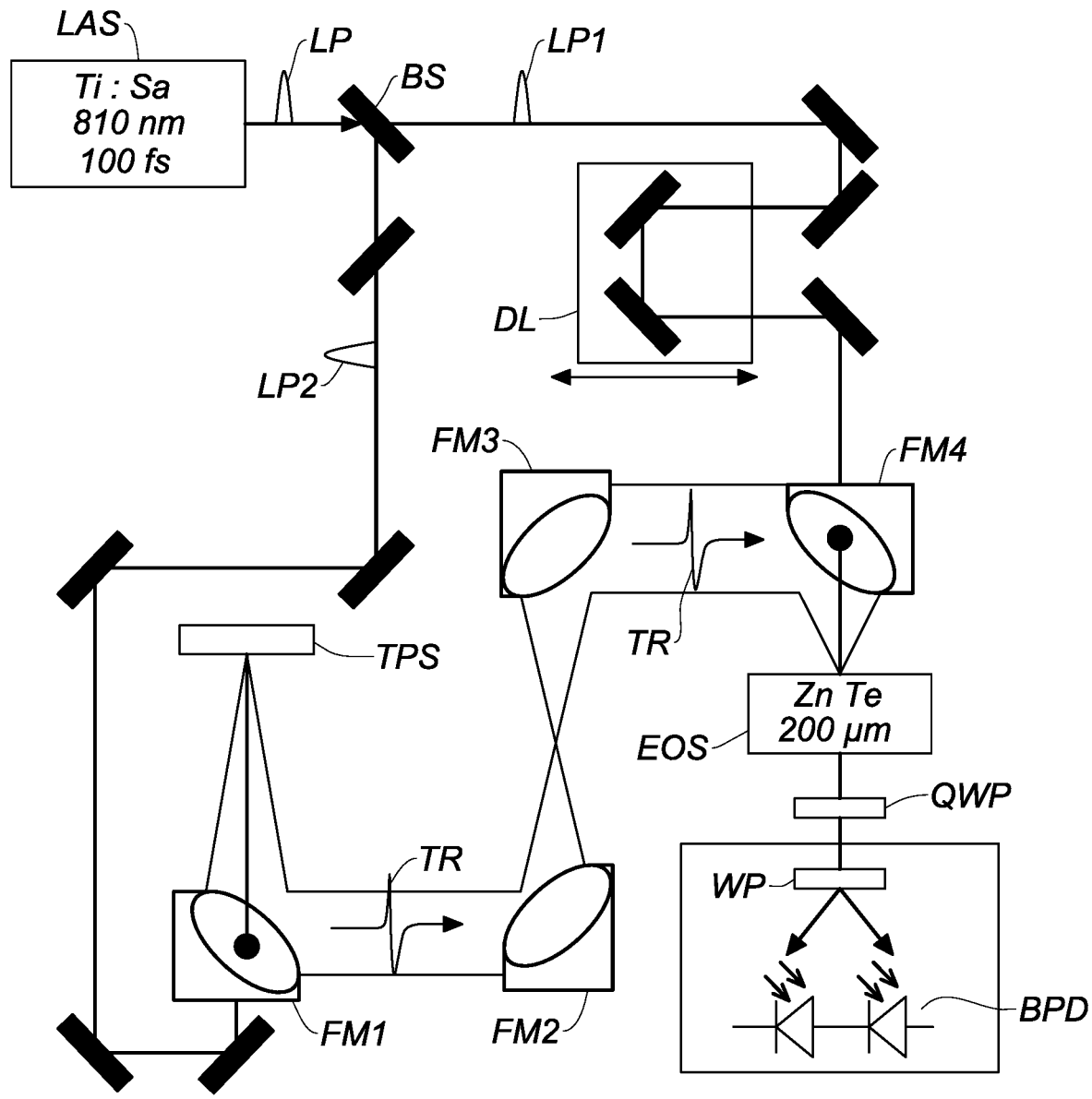
Figure 8:
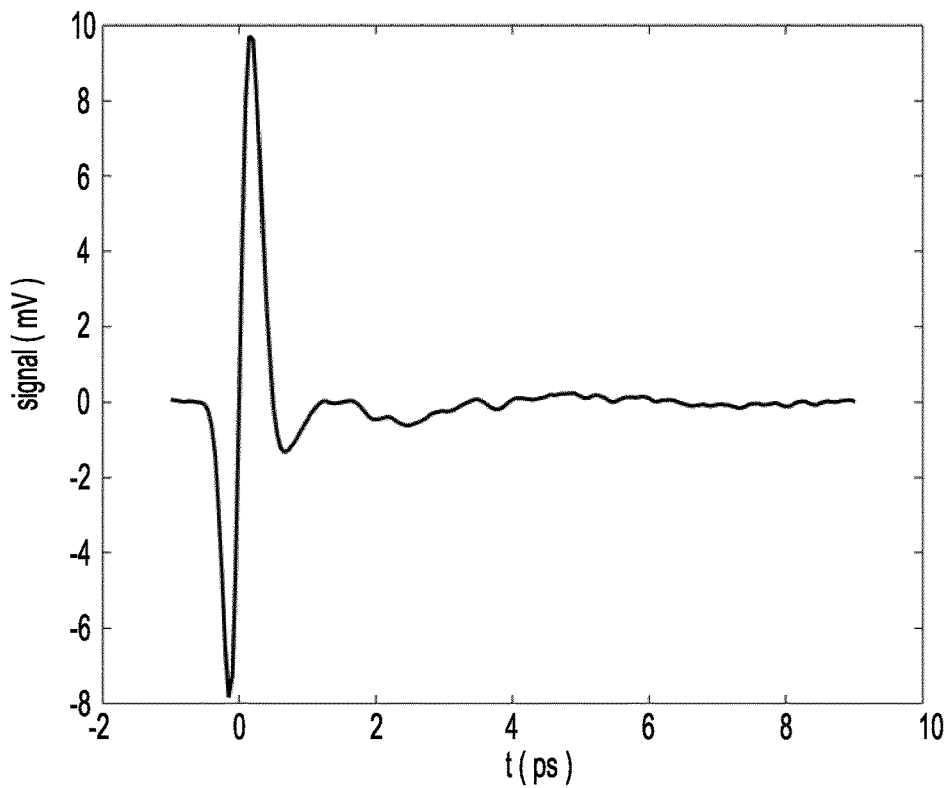
Figure 9:
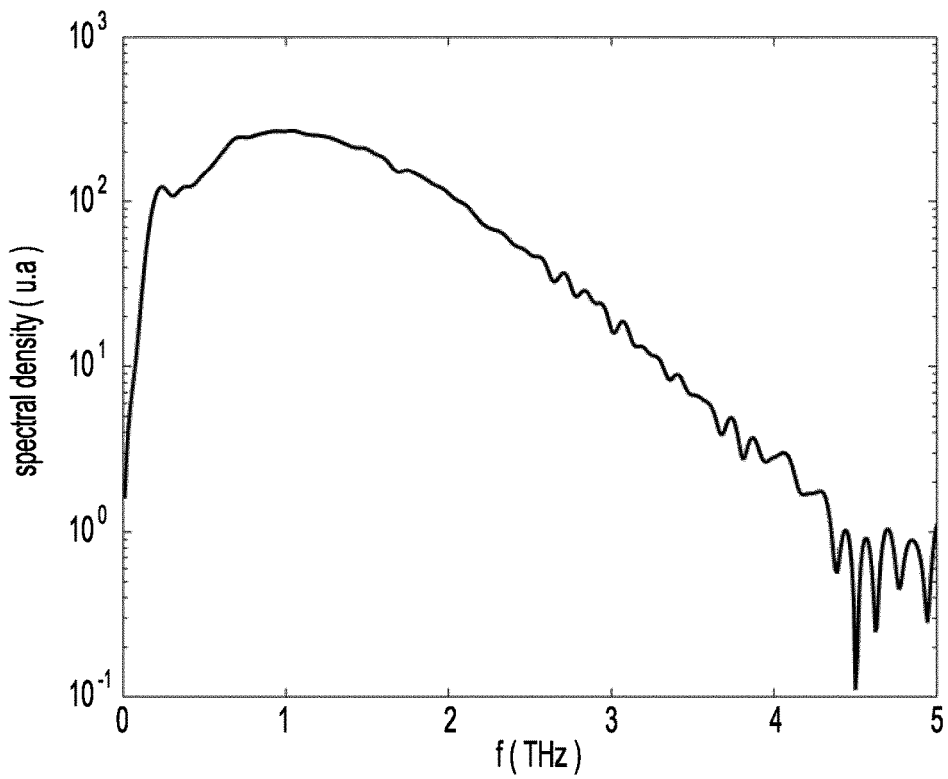

Additional features and advantages of the present invention will become apparent from the subsequent description, taken in conjunction with the accompanying drawings, which show:

FIG. 1, an illustration of the structure and functioning of a conventional photoconductive switch;

FIGS. 2A, 2B and 2C, illustrations of a principle at the basis of the operation of the invention, used for emitting THz radiation;

FIG. 3, an illustration of a principle at the basis of the operation of the invention, when used for detecting THz radiation;

FIGS. 4A and 4B, an illustration of the structure of a photoconductive switch according to a first exemplary embodiment of the invention;

FIG. 5, an illustration of the structure of a photoconductive switch according to a second exemplary embodiment of the invention;

FIGS. 6A and 6B, an illustration of the structure of a photoconductive switch according to a third exemplary embodiment of the invention;

FIG. 7, a schematic diagram of an apparatus for testing the operation of a photoconductive switch according to the invention;

FIGS. 8 and 9, experimental results obtained using the apparatus of FIG. 7; and

Figure 10:
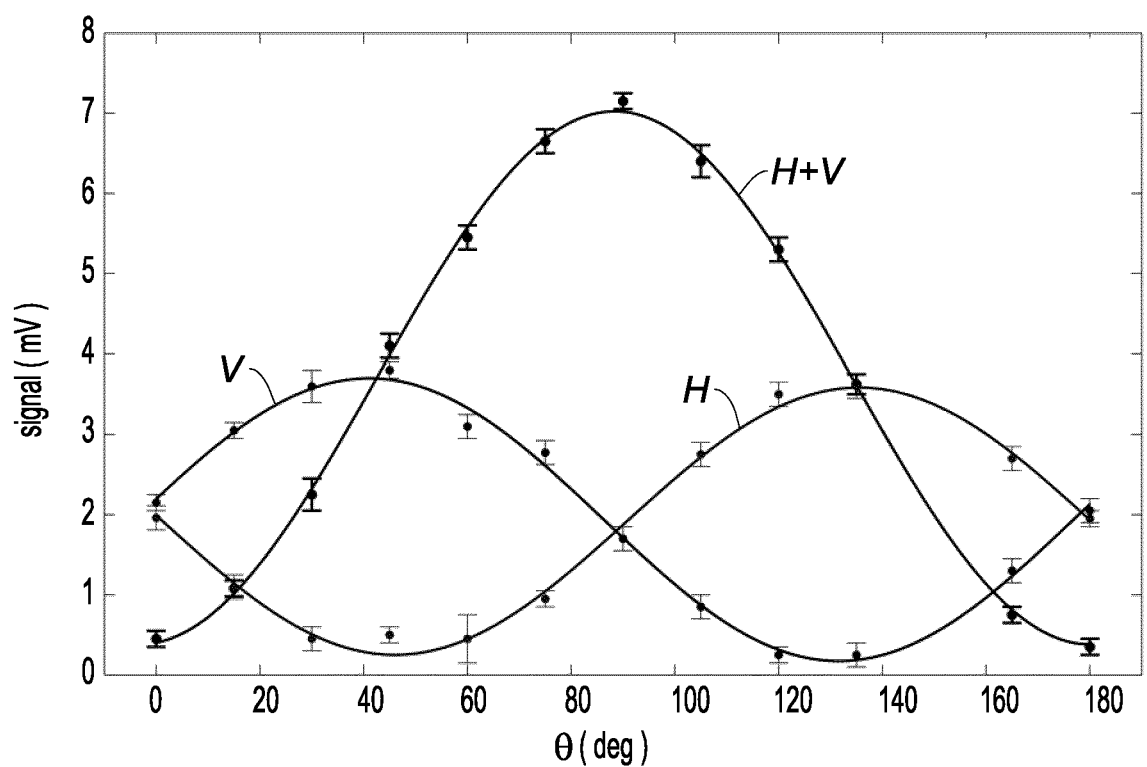

FIG. 10, experimental results showing that the invention does allow controlling the polarization direction of the generated THz radiation.

DETAILED DESCRIPTION

As shown on FIG. 1, a conventional photoconductive switch (or "photoconductive antenna") TPS comprises a photoconductive substrate SUB made of a semiconductor material such as GaAs, having a surface SS carrying two metal electrodes $E_1$ and $E_2$ facing each other and separated by a gap G. A voltage V is applied through the gap by connecting electrode $E_1$ to a voltage generator VG and electrode $E_2$ to the ground. The electric resistance of the semiconductor material being quite large (greater than $10^7$ $\Omega \cdot cm$ for GaAs), the current density flowing through the gap is small.

In order to generate THz radiation, an ultrashort (i.e. picosecond or femtosecond) laser pulse LP, having a photon energy larger than the bandgap of the semiconductor material of the substrate SUB, is directed towards the surface SS, and more precisely toward the gap G. The light absorption from the substrate generates pairs of electrons and holes, which migrate towards respective electrodes (electrons towards $E_1$ and holes towards $E_2$, assuming that $E_1$ is kept at a higher potential than $E_2$) resulting in a sudden current surge. The current density then decreases at a rate depending of the pair recombination time, or carrier lifetime, of the semiconductor material, typically in a time of a few picoseconds. According to the laws of electrodynamics, the current surge and decrease generate an electromagnetic radiation pulse TR, whose main spectral components are in the THz range. Pulse TR is linearly polarized along the direction of a line connecting electrodes $E_1$ and $E_2$, i.e. the direction along which the gap G extends (direction y on the figure, z being the propagation direction of both the light pulse LP and the THz pulse TR).

The device of FIGS. 2A, 2B and 2C differs from that of FIG. 1 in that it comprises two pairs of facing electrodes: $E_{V1}$, $E_{V2}$, separated by a first gap $G_v$ extending in the y direction, and $E_{H1}$, $E_{H2}$, separated by a first gap $G_v$ extending in the x direction. A first controllable voltage generator VVG applies a first voltage $V_V$ between electrodes $E_{V1}$ and $E_{V2}$, i.e. across the first gap, and a second controllable voltage generator HVG applies a second voltage $V_H$ between electrodes $E_{H1}$ and $E_{H2}$, i.e. across the first gap. The voltage generators are driven by a controller CTR (e.g. a computer or a microprocessor system), which determines the values taken by $V_V$ and $V_H$. FIG. 2A represents a situation wherein $V_H=0$ while $V_V \neq 0$. In this case, the photogenerated current flows in the y direction, and the THz pulse TR is also polarized along this direction. FIG. 2B represents a situation wherein $V_H \neq 0$ while $V_V=0$. In this case, the photogenerated current flows in the x direction, and the THz pulse TR is also polarized along this direction. In the case of FIG. 2C, both $V_V$ and $V_H$ are different from zero, and the polarization direction of the THz pulse TR forms and angle $\theta=\tan^{-1}(V_H/V_V)$ with the y-axis. It can then be seen that by varying the ratio between the two voltage values $V_V$ and $V_H$ it is possible to finely control the polarization direction of the THz radiation.

As illustrated on FIG. 3, a similar approach allows measuring the polarization direction of an incoming THz pulse. The device of FIG. 3 is similar to that of FIGS. 2A, 2B and 2C except in that the voltage generators VVG and HVG and the controller CTR are replaced by two readout circuits RCV, RCH measuring the current flowing through respective electrode pairs and a processor PR. Moreover, as it is well known in the art, the photoconductive materials used for THz detection preferably exhibit shorter carrier lifetimes than those used for THz generation. A suitable choice for the substrate of the switch of FIG. 3 is LT-GaAs (i.e. GaAs grown at low temperature).

Processor PR receives the measured current values and outputs an indication of the polarization direction. The THz pulse TR whose polarization is to be measured impinges onto the surface of the photoconductive switch TPS, temporally and spatially overlapping with a light pulse LP. The light pulses photogenerate charge carriers, which are accelerated by the electric field of the THz pulse, resulting in an electric current flowing along the polarization direction of the latter (assumed to form an angle θ with the y-axis). The two readout circuits measure the x- and y-components of the electric current density, from which the value of θ can be deduced.

The photoconductive switch of FIGS. 2A-C and 3 has a very small photosensitive area, which severely limits the power of the THz pulses it can generate, as well as its sensitivity when it is used as a detector. Moreover, it is not easily scalable.

The present invention allows overcoming these drawbacks by replacing the simple linear electrodes of FIGS. 1, 2A-C and 3 by at least two pairs of structured electrodes. The electrodes of the first pair face each other defining a first gap having a complex shape, comprising a plurality of rectilinear section extending along a first direction (say, the x direction). Similarly, the electrodes of the second pair face each other defining a second gap also having a complex shape, comprising a plurality of rectilinear section extending along a second direction different from—and preferably perpendicular to—the first one (say, the y direction). The complex geometry of the electrodes allows obtaining a comparatively large emitting area, and therefore to increase the power of the generated THz radiation with respect to the previously-considered cases. As in the case of FIGS. 2A-2B, polarization control of the generated THz radiation is obtained by applying controlled voltages between the electrodes of the two pairs. The photoconductive switch may also be used for detecting THz radiation, as discussed above with reference to FIG. 3.

For the generated THz radiation to exhibit a spatially uniform polarization state, the two pairs of electrodes should be intermixed, forming a substantially homogeneous pattern at the scale of the wavelength of the THz radiation. More precisely, the electrode patterns should be homogeneous at a scale L satisfying:

$$L \leq \frac{\lambda_{THz\_min}}{N}$$

where $\lambda_{THz\_min}$ is the shortest wavelength of the THz band of interest and N—typically of the order magnitude of, but smaller than one—is the numerical aperture of the THz radiation collecting optics.

For instance, the rectilinear sections of the first and second electrode pairs should occupy surfaces of a same order of magnitude over a region of the substrate having a radius of at least 100 μm, and preferably more. Ideally, the surface occupied by the rectilinear sections of the first and second electrode pairs should be identical, but differences of up to 10% or 30% are acceptable and can be compensated by suitably modifying the voltages applied to the electrodes.

This condition should also be fulfilled when the photoconductive switch is used in reception in order to obtain uniform sensibility to the polarization direction.

Moreover, as it will be explained below, a patterned opaque layer must be provided to mask some parts of the gaps, to avoid destructive interference between their contributions to the radiated THz field. The same is true when the photoconductive switch is used in reception.

FIG. 4A shows the electrode patterns of a photoconductive switch according to a first embodiment of the inventions. The switch comprises two pairs of interdigitated electrodes $E_{V1}$, $E_{V2}$ and $E_{H1}$, $E_{H2}$ forming a square region R divided into four quadrants, each having a side of 75 μm length. Electrodes $E_{V1}$, $E_{V2}$ are separated by a first gap $G_V$ and electrodes $E_{H1}$, $E_{H2}$ are separated by a second gap $G_H$. Both gaps have a complex shape, similar to that of the electrodes.

Electrodes $E_{V1}$ and $E_{V2}$ occupy the first and third quadrant; they both comprise fingers which extend in the x-direction from a "stem" oriented along the y-direction. The stems are disposed at opposite ends of each quadrant, and the fingers of an electrode protrude towards the stem of the other electrode of the pair. Each finger of an electrode (except for those at the border of the pattern) is surrounded by two fingers of the other electrode of the pair, separated by them by a rectilinear section of gap $G_V$ extending in the "vertical" y-direction. Similarly, electrodes $E_{H1}$ and $E_{H2}$ occupy the second and fourth quadrants; they both comprise fingers which extend in the y-direction from a stem oriented along the x-direction. The stems are disposed at opposite ends of each quadrant, and the fingers of an electrode protrude towards the stem of the other electrode of the pair. Each finger of an electrode (except for those at the border of the pattern) is surrounded by two fingers of the other electrode of the pair, separated by them by a rectilinear section of gap $G_H$ extending in the "horizontal" x-direction.

For each point of a "vertical" section of the first gap $G_V$, suitable to emit y-polarized THz radiation, there is a corresponding point of a "horizontal" section of the second gap $G_H$, suitable to emit x-polarized THz radiation, which is at most 75 μm away. These two points can only be resolved by radiation having a wavelength shorter than $\lambda_{THz\_min}=2D \cdot N$ e.g. 75 μm, corresponding to a frequency of 4 THz, for a numerical aperture of 0.5. For longer-wavelength (i.e. lower frequency) radiation, they can be considered as a single point-like source. Therefore it can be expected that the photoconductive switch of FIG. 4A can be used to generate electromagnetic radiation with a frequency up to 4 THz. Numerical simulations show that a very well defined, spatially uniform linear polarization state is obtained for frequencies up to 2-3 THz. Higher frequency radiation can also be generated, but with a less uniform polarization state, which can be acceptable or not depending on the specific application considered.

However, by itself, the electrode pattern of FIG. 4A does not allow generating any THz radiation, or a vanishingly small amount of it, because of destructive interferences between different points of the emitting gaps. Let us assume that electrode $E_{V1}$ is kept at a higher voltage than $E_{V2}$; a finger of electrode $E_{V1}$ is surrounded by two fingers of electrode $E_{V2}$, one situated "above" it (i.e. at a position corresponding to a larger value of y) and the other one "below" it (i.e. at a position corresponding to a smaller value of y). Electric field lines going from the $E_{V1}$ finger to the first $E_{2V}$ neighboring finger are directed along the positive direction of the y-axis, and the electric field lines going from the $E_{V1}$ finger to the second $E_{V2}$ neighboring finger are directed along the negative direction of the y-axis. It will then be easily understood that, upon illumination of the surface of the photoconductive substrate, two opposite current densities will flow from the $E_{V1}$ finger towards the two neighboring $E_{V2}$ fingers, whose contribution to the generation of THz radiation will cancel each other. To avoid this destructive interference, it is necessary to mask one of every two linear sections of the gaps in such a way that the electric current flows with a same first direction (either positive-y or negative-y) across all the unmasked gap sections of the first and third quadrants, and with a same second direction (either positive-x or negative-x) across all the unmasked gap sections of the second and fourth quadrants.

FIG. 4B shows a sectional view of a portion of the first or third quadrant of the photoconductive switch of FIG. 4A. Reference A designates the width of the gap $G_V$ between neighboring fingers of electrodes $E_{V1}$ and $E_{V2}$. A transparent, electrically insulating layer TL, e.g. made of $SiO_2$ covers the surface SS of the substrate SUB. A patterned opaque layer PML, e.g. made of metal, is deposited over the transparent layer to mask one gap $G_V$ out of two, as explained above. It can be easily seen that, due to the presence of the patterned opaque layer, only current density flowing to the right of the figure is generated.

It is important to note that layer TL must be transparent to both the light used for photogenerating carriers in the substrate and to THz radiation, while it is sufficient that the PML layer is opaque to either light or THz radiation (in the latter case, interfering radiation is generated, but cannot propagate away from the surface of the photoconductive switch).

FIG. 5 illustrates the structure of a photoconductive switch according to a second exemplary embodiment of the invention, which can be considered an improvement of the first embodiment. This switch also comprises two pairs of interdigitated electrodes; however, the "ground" electrodes of each pair are connected together, effectively constituting a single electrode $E_G$ (the two other electrodes—intended to be connected to voltage generators or readout circuits—are labeled $E_V$ and $E_H$). These electrodes also form a square pattern, which is larger than that of FIG. 4A, having a side of 300 µm. This square is subdivided into four "quadrants" which are shaped like pieces of a jigsaw puzzle, in such a way that the characteristic scale of the pattern is 75 µm—and not 150 µm as it would have been the case if the pattern of FIG. 4A had simply been magnified by a factor of two. Numerical simulations show that this pattern, too, allows generating electromagnetic radiation with a frequency up to 1.5 THz and showing a well defined, spatially uniform linear polarization state. Satisfactory operation at higher frequency (up to approximately 2-2.5 THz, the precise value depending, of course, on the acceptability criterion) may be achieved by only illuminating the central part of the pattern but, of course, this reduces the power level of the generated THz radiation.

An opaque masking pattern must also be provided to suppress destructive interference.

A third embodiment of a photoconductive switch according to the invention is illustrated on FIGS. 6A and 6B. This switch comprises three electrodes—a ground electrode $E_{GR}$ and two other electrodes intended to be connected to voltage generators or readout circuits, $E_{10}$ and $E_{20}$—having complex shapes. More precisely, each of these electrodes comprises a plurality of stair-shaped or "zigzag" electrodes including alternating rectilinear segments extending in the x and y-direction. Three appendages, one for each electrode, form a band, an appendage of the ground electrode $E_G$ being disposed between an appendage of $E_{10}$ and an appendage of $E_{20}$. Within each band, the appendage of $E_{10}$ is separated from that of $E_G$ by a first stair-shaped gap, and the appendage of $E_{20}$ is separated from that of $E_G$ by a second stair-shaped gap. This electrode pattern, illustrated on FIG. 6A, is partially masked by a patterned absorbing layer, shown on FIG. 6B. It can be seen that only:

"horizontal" (x-oriented) sections of the first gaps; and
"vertical" (y-oriented) sections of the second gaps remain unmasked.

This embodiment allows achieving a more uniform polarization state of the THz radiation that the photoconductive switches of FIGS. 4A-B and 5, and is easily scalable to larger surfaces. However, given that most of the photoconductive surface is masked, the THz power generated per unit surface is lower.

The electrode patterns of FIGS. 4A-B, 5 and 6 are by no mean limitative of the scope of the invention. For instance, it is not strictly necessary that the "active" linear sections of the gaps extend in mutually perpendicular direction, even if this is a preferred feature: it is only required that they are not parallel to each other.

FIG. 7 illustrates a TDS setup used to test the operation of a prototype photoconductive switch according to the invention. The prototype used the electrode pattern of FIG. 5 with a 450×450 µm area. The photoconductive substrate was a 500 µm-thick semi-insulating wafer of GaAs. Electrodes were fabricated by lithography, and were made of a 150 nm gold layer deposited on a 5 nm chrome layer. Electrode separation was 4 µm. The transparent layer TL was 300 nm thick and made of $SiO_2$ deposited by ionic sputtering. The patterned opaque layer had the same structure and composition as the electrodes.

A Ti:Sa laser source LAS generates 100-fs laser pulses LP at a wavelength of 810 nm. A beam splitter BS separates each pulse LP into two pulses LP1, LP2 propagating along a first and a second path, respectively. The second path, along which LP1 propagates, comprises a variable delay line DL. The second pulse LP2 propagates through a focusing mirror FM1 which is highly reflective in the terahertz region of the spectrum but transparent at 810 nm—or which is traversed by a hole through which the laser pulse can pass—and impinges onto a photoconductive switch TPS according to the invention. The THz pulse TR generated by the photoconductive switch propagates towards mirror FM1 which collimates it; then it is focused by a second mirror FM2, collimated again by a third mirror FM3 and focused, by a fourth mirror FM4, on a 200 µm-thick ZnTe crystal EOS. The second laser pulse LP2 also impinges on crystal EOS through mirror FM4. The laser pulse LP2 and the THz pulse TR spatially overlap; delay line DL can be adjusted to make them temporally overlap, too.

Both the laser pulse LP2 and the THz pulse TR have a linear polarization forming an angle of 45° with the ordinary and extraordinary axis of the ZnTe crystal EOS and of a quarter-wave plate QWP following it. In the absence of THz radiation, the quarter-wave plate converts the polarization of the LP2 pulses from linear to circular. A Wollastone prism WP decomposes this circular polarization into two spatially separated linear components, which impinges onto respective photodiodes of a balanced photodetector BPD. The two components having a same intensity, the output signal of the balanced photodetector is zero. Due to electro-optic effects in the EOS crystal, the electric field of the THz pulse TR induces a rotation of the polarization plane of the laser pulses, proportional to its amplitude. Due to this rotation, the laser polarization state downstream the quarter-wave plate is no longer circular, but elliptical. This induces an imbalance between the two components separated by the Wollastone prism, and therefore a non-zero output signal of the balanced photodetector. By varying the delay between the laser pulse LP2 and the THz pulse (which can be done by using the variable delay line DL), one obtains a signal representative of the THz electric field in the time domain. This is illustrated on FIG. 8, FIG. 9 showing the corresponding spectrum. These results are typical of a conventional photoconductive THz generator.

In order to test the polarization control properties of the inventive device, the generated THz power was measured using a conventional pyroelectric detector associated to a mechanical THz polarizer.

The photoconductive switch was positioned so the y-axis corresponds to an angle of about 45° with respect to the analyzer's axis, while the x-axis of the switch corresponded to 135°. In a first measurement, only the y-axis voltage was turned on, and the analyzer was rotated. The detected power showed a clear sinusoidal oscillation (dots on the curve labeled V on FIG. 10, the curve itself being a sinusoidal interpolation), as expected for a linear polarization along the y axis. A second measurement was performed by turning on the x-axis voltage; the detected power showed again a sinusoidal oscillation with opposite phase than the previously measured one (dots on the curve labeled H on FIG. 10, the curve itself being a sinusoidal interpolation), as expected for a linear polarization along the x axis. In a third measurement, both voltages were turned on, resulting in a sinusoidal oscillation with a doubled peak amplitude and a peak at 90° (dots on the curve labeled H+V on FIG. 10, the curve itself being a sinusoidal interpolation), as expected for a vector sum of the THz fields with x and y polarization. These results show that the photoconductive switch behaves as expected and therefore allows the generation of THz pulses with a continuously and electrically-controlled linear polarization direction.

The invention claimed is:

1. A photoconductive switch for generating or detecting linearly-polarized terahertz radiation comprising:
   a photoconductive substrate; and
   a plurality of electrodes on a surface of the photoconductive substrate
   wherein said plurality of electrodes comprises:
   a first pair of structured electrodes separated by a first gap comprising at least a plurality of first rectilinear sections extending along a first direction (x); and
   a second pair of structured electrodes separated by a second gap comprising at least a plurality of second rectilinear sections extending along a second direction (y), different from the first direction;
   wherein the photoconductive switch further comprises a patterned opaque layer opaque to at least one of terahertz radiation and visible or infrared radiation suitable to induce an increase of a substrate conductivity, selectively masking portions of the first and second gaps between the first and second pairs of structured electrodes, in such a way that only some sections remain unmasked, said sections including:
   the plurality of first rectilinear sections of the first gap such that, upon application of a first voltage between the electrodes of the first pair of structured electrodes and illumination by said visible or infrared radiation, a first electric current flows with a same first electric current flow direction and orientation across all said unmasked first rectilinear sections of the plurality of first rectilinear sections; and
   the plurality of second rectilinear sections of the second gap such that, upon application of a second voltage between the electrodes of the second pair of structured electrodes and illumination by said visible or infrared radiation, a second electric current flows with a same second electric current flow direction and orientation across all said unmasked second rectilinear sections of the plurality of second rectilinear sections.

2. The photoconductive switch according to claim 1, wherein a cumulative surface of the plurality of first rectilinear sections of the first gap and a cumulative surface of the plurality of second rectilinear sections of the second gap over a region of the photoconductive substrate having a radius of at least 100 µm are equal or differ by no more than 30%.

3. The photoconductive switch according to claim 1, wherein the first direction (x) and the second direction (y) are perpendicular to each other.

4. The photoconductive switch according to claim 1, wherein:
   the first and second gaps extend over a region of the surface of the photoconductive substrate having a radius of at least 100 µm; and
   at least a majority of the plurality of first rectilinear sections of the first gap is less than 100 µm apart from a corresponding majority of the plurality of second rectilinear sections of the second gap.

5. The photoconductive switch according to claim 1, further comprising a transparent layer, transparent to both terahertz radiation and visible or infrared radiation suitable to induce an increase of the substrate conductivity, disposed between the first and the second pairs of structured electrodes, and the patterned opaque layer.

6. The photoconductive switch according to claim 1, wherein both the first pair of structured electrodes ($E_V$, $E_G$) and the second pair of structured electrodes ($E_H$, $E_G$) are interdigitated electrodes, each electrode of each pair comprising a plurality of fingers protruding toward an opposite structural electrode of a same pair, the fingers of the electrodes of the first pair of structured electrodes being separated by the plurality of first rectilinear sections of the first gap extending along the first direction (x) and the fingers of the electrodes of the second pair of structured electrodes being separated by the plurality of second rectilinear sections of the second gap extending along the second direction (y); and wherein the patterned opaque layer (PML) alternately masks one first rectilinear sections of first gap out of two and one second rectilinear sections of second gap out of two.

7. The photoconductive switch according to claim 1, wherein the first pair of structured electrodes and the second pair of structured electrodes comprise a plurality of stair-shaped appendages, each comprising alternating rectilinear segments extending along said first direction (x) and said second direction (y), the patterned opaque layer masking rectilinear sections of the first gap extending along the second direction (y) and rectilinear sections of the second gap extending along the first direction (x).

8. The photoconductive switch according to claim 1, wherein said first and second pairs of structured electrodes share a common electrode.

9. A device for generating terahertz radiation with a controlled polarization direction comprising:
the photoconductive switch according to claim 1;
a first controllable voltage generator connected to the first pair of structured electrodes for imposing a first voltage across the first gap; and
a second, independently controllable, voltage generator connected to the second pair of structured electrodes for imposing a second voltage across the second gap.

10. The device according to claim 9, further comprising a controller configured for driving said first and second controllable voltage generators in order to set values of said first and of said second voltage as a function of a target polarization direction of the terahertz radiation.

11. A method for generating terahertz radiation with the controlled polarization direction using the device according to claim 9, the method comprising:
using the first controllable voltage generator for imposing the first voltage across the first gap and the second controllable voltage generator for imposing the second voltage across the second gap, a ratio of the first and the second voltage being determined as a function of a target polarization direction of the terahertz radiation to be generated; and
directing pulsed light towards a region of the substrate having a radius of at least 100 μm.

12. A device for detecting terahertz radiation comprising:
the photoconductive switch according to claim 1;
a first readout circuit connected to the first pair of structured electrodes for detecting a first current flowing through said electrodes; and
a second readout circuit connected to the second pair of structured electrodes for detecting a second current flowing through said electrodes.

13. The device according to claim 12, further comprising a processor configured for acquiring, from said first and second readout circuits, signals indicative of said first and second currents, and for determining a polarization direction of an impinging terahertz radiation from said signals.

14. A method for detecting terahertz radiation using the device according to claim 12, the method comprising:
directing pulsed light towards a region of the substrate having a radius of at least 100 μm;
using the first readout circuit for detecting the first current, and the second readout circuit for detecting the second current; and
determining a polarization direction of an impinging terahertz radiation from a ratio of the first and the second current.

* * * * *